United States Patent [19]

Oddy et al.

[11] Patent Number: 5,041,169

[45] Date of Patent: Aug. 20, 1991

[54] FLUX COMPOSITION

[75] Inventors: Malcolm R. Oddy, Epsom; Alison M. Wagland, Reading, both of United Kingdom

[73] Assignee: Cookson Group plc, London, United Kingdom

[21] Appl. No.: 462,036

[22] Filed: Jan. 8, 1990

[30] Foreign Application Priority Data

Jan. 9, 1989 [GB] United Kingdom ............... 8900381

[51] Int. Cl.$^5$ ............................................. B23K 35/34
[52] U.S. Cl. ......................................... 148/23; 148/25
[58] Field of Search ................................ 148/24–26, 148/23

[56] References Cited

U.S. PATENT DOCUMENTS

| | | |
|---|---|---|
| 1,757,118 | 5/1930 | Harris .................................... 148/25 |
| 2,248,104 | 7/1941 | Marini ................................... 148/23 |
| 2,250,940 | 7/1941 | Zahn ..................................... 148/23 |
| 2,474,863 | 7/1949 | Rinkenbach ......................... 148/25 |
| 3,305,407 | 2/1967 | Koeplinger .......................... 148/24 |
| 3,467,556 | 9/1969 | Stayner ................................ 148/23 |
| 3,478,414 | 11/1969 | Potter ................................... 148/23 |
| 3,597,285 | 8/1971 | Aronberg ............................. 148/25 |
| 3,941,588 | 3/1976 | Dremann ............................. 148/24 |
| 4,350,602 | 9/1982 | Schiller ................................ 148/23 |
| 4,360,144 | 11/1982 | Cuddy .................................. 148/23 |
| 4,360,392 | 11/1982 | Roberts ................................ 148/23 |

Primary Examiner—Peter D. Rosenberg
Attorney, Agent, or Firm—Watson, Cole, Grindle & Watson

[57] ABSTRACT

A flux composition comprising at least one benzoate or substituted benzoate of phenol or of a substituted phenol, such as cresyl benzoate or 2,6-dimethylphenyl benzoate, a solvent for the benzoate, and a flux-activating agent, the benzoate being present in an amount not more than its limit of solubility in the solvent.

12 Claims, No Drawings

FLUX COMPOSITION

BACKGROUND OF THE INVENTION

The invention relates to a flux composition for use in soft soldering.

Soft solders are used in many industries, but particularly in the electronics industry where they are used for soldering printed circuit boards. For this and all other applications the solder must be able to wet the substrate, if the solder is to form a good bond. Thus a flux will be employed to improve the ability to wet the substrate. One of the properties which a flux should possess is the ability to remove surface oxide film from the substrate and thus the constituents of a flux are often both active and corrosive.

In the electronics industry, however, it is desirable to use fluxes of fairly low activity and which are non-corrosive in that they will not result in corrosion of the soldered joint over a period of time even if it becomes damp. Corrosion is most often caused by corrosive flux residues being left on the substrate. Thus any residue left should be non-corrosive and also leave little residue as possible.

Fluxes for use with printed circuit boards have been formulated using natural rosin as the basic constituent, usually together with other ingredients such as flux-activating agents. These fluxes have been sold either in the form of cored wire or as a solution where the rosin and other solid components are dissolved in a suitable solvent. However, such rosin fluxes have tended to leave appreciable quantities of residue which, although generally non-corrosive, are undesirable. The residues may be unsightly and their mere presence on a circuit board may cause problems. For example, if automatic circuit test equipment is used the contact pins may become clogged with flux residues. Some residues may be removed by washing the circuit boards with chlorofluorocarbons (CFCs), but this necessitates a further processing step, thus increasing cost and also CFCs are known to be bad for the environment.

Liquid fluxes containing active ingredients in a solvent are preferred for use with printed circuit boards because of their ease of application, for example, by immersion, foaming or spraying.

It is therefore desirable to produce liquid flux systems which contain a low solids content and which, after completion of the soldering process leave little residue.

British Patent No. 1550648 aims to reduce the unpleasant fumes associated with traditional fluxes containing rosin. It describes flux compositions comprising as an essential constituent at least one neutral ester of a polyhydric alcohol having a molecular weight of at least 300, and at least one additional constituent selected from organic acids, flux-activating agents and flux residue-hardening agents. However, in many of the examples a dimerised or other rosin compound is employed as the flux residue hardening agent and thus these compositions still leave appreciable residues.

Furthermore, the usefulness of a flux can vary considerably depending on the conditions of use and the sort of application. In some cases a flux system may work well with one circuit board surface but unsatisfactorily with another. One possible reason for this is that the flux system has to interact with so many different parts. It interacts not only with the printed circuit board surface but also with the resist coating, component leads and components, and also with the metallic surfaces of conductors, tracks, plated holes and pads. Thus, it is not surprising that the effectiveness of fluxes can vary depending on the particular nature of the soldering environment and the materials used. There remains a demand for further and improved fluxes to be developed.

We have now developed a composition suitable for use as a liquid soft soldering flux and which has the advantage of producing a very small amount of residue.

SUMMARY OF THE INVENTION

In accordance with the present invention there is provided a flux composition comprising at least one benzoate or substituted benzoate of phenol or of a substituted phenol, a solvent for the benzoate, and a flux-activating agent, the benzoate being present in an amount not more than its limit of solubility in the solvent.

The composition will comprise at least one benzoate or substituted benzoate of phenol or of a substituted phenol. Substituents which may be present on the phenyl ring of the substituted benzoate and/or of the substituted phenol include aryl groups and $C_1$ to $C_{10}$ aliphatic hydrocarbon groups which may contain oxygen, for example alkyl, alkenyl, alkoxy groups and carbonyl-containing groups including ketones, amides and aldehydes. Amine substituents such as $N(CH_3)_2$ may be employed but will generally not be preferred as they can interact with some surfaces of substrates to be soldered. Halogen substituents will not usually be included because of the possible toxicity of organic compounds containing them.

The most preferred benzoates are those which contain as substituents one or more lower alkyl groups particularly methyl or ethyl. Examples of particularly preferred benzoates which may be employed in the present invention are phenyl benzoate, metacresyl benzoate, orthocresyl benzoate, paracresyl benzoate, 2,6-dimethylphenyl benzoate and 3-ethylphenyl-4-methoxy benzoate.

Further examples of benzoates which may be employed in the invention include 4-$^t$octylphenyl benzoate, 3-ethylphenyl benzoate, 2-allylphenyl benzoate, 4-$^t$octylphenyl-4-methyl benzoate, 2,6-dimethylphenyl-4-methoxy benzoate and 4-$^t$octylphenyl-4-methoxy benzoate.

Benzoate compounds can be prepared via the standard Schotten-Baumann procedure.

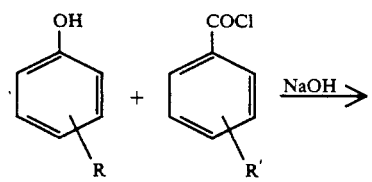

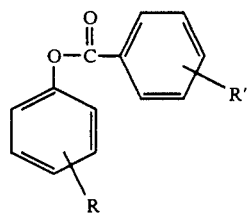

A general method for solid benzoate compounds is given below:

To a solution of phenol or a substituted phenol (1 equivalent) in 10% aqueous sodium hydroxide solution, is added benzoyl chloride, or a substituted benzoyl chloride (1.2 equivalents). The flask is stoppered and shaken vigorously for 15-20 minutes. The solid product is removed by filtration, washed with water and dried.

For liquid benzoate compounds in which the product cannot be separated by filtration the following method can be used. To a solution of the phenol or substituted phenol (1 equivalent) in 10% aqueous sodium hydroxide solution, is added benzoyl chloride (1.2 equivalents). The mixture is stoppered and shaken vigorously for 15-20 minutes until the odor of the benzoyl chloride has disappeared. The oily mixture is then extracted with chloroform (3 times), the combined organic layers washed with distilled water, dried (MgSO$_4$) and concentrated under reduced pressure to yield the liquid benzoate.

The benzoate will be dissolved in a suitable organic solvent or a mixture of solvents. Examples of solvents which may be employed in the invention are isopropanol, methanol, ethanol, butanol diethylene glycol, ethylene glycol, acetone, methylethylketone and other glycol ether and ketone solvents. Isopropanol is particularly preferred as solvent.

The benzoate will usually be present in the composition in an amount of at least 0.5%wt/vol in order to produce a sufficiently effective flux. Preferably about 1 wt %/vol will be present. The benzoate may be present in the composition in an amount up to its limit of solubility in the solvent. However, generally it will be desired to keep the amount of benzoate and other active ingredients present as small as possible, while still producing an active flux, in order to limit the amount of residue that may be produced.

The purpose of the solvent is to enable easy application of the flux ingredients to the surface to be soldered. The solvent should not react with the substrate.

The solvent will be relatively volatile so that it can be easily removed either by spontaneous evaporation or by application of gentle heat. If the flux is used for wave soldering of a printed circuit board, generally a proportion of the solvent will be removed by heat from the pre-heater. Typically, when a pre-heater is employed the lower side of a circuit board at which the heat is directed will reach a temperature above 90° C. while the surface of the circuit board on the upper side will reach a temperature of above 70° C.

The flux composition will include a flux-activating agent. This helps to dissolve oxide film on the substrate to be soldered. Flux-activating agents are well known in the art. Examples of known flux-activating agent which may be used include organic acids, which may be aliphatic or aromatic mono or polycarboxylic acids, particularly adipic acid, benzoic acid, azelaic acid, succinic acid and suberic acid; aryl sulphonic acids; hydrohalide salts of aliphatic and aromatic amines; and hydrohalide salts of aliphatic hydroxyamines.

The flux composition may also include a surface active agent to improve the wetting ability of the flux composition. A flux composition would generally be applied to a circuit board either by spraying or by foaming. Spraying can be a messy application technique so foaming is generally preferred for commercial applications as it is more controllable. Foamable flux compositions will necessarily contain surface active agents which will have the effect of enabling the formation of the foam as well as improving wettability. Surface active agents are well known in the art. Examples of known surface active agents which may be used include fatty alcohol ethoxylates, octyl and nonyl phenyl ethoxylates and ester ethoxylates.

Particularly favorable results have been achieved with flux compositions which comprise metacresol benzoate, orthocresol benzoate, paracresol benzoate, or 2,6-dimethylphenyl benzoate, isopropanol and a flux-activating agent.

The invention includes a method of preparing a printed circuit board which includes the step of applying a flux composition of the kind described above to the surface of the printed circuit board before soldering. The invention also includes a printed circuit board which has been prepared by this method.

EXAMPLE 1

Preparation of Benzoate

Metacresyl benzoate was prepared by vigorously shaking a mixture of metacresol (1 equivalent, 5 grams) and benzoyl chloride (1.2 equivalents, 7.1 grams) in a 10% aqueous solution of sodium hydroxide (100 ml) in a stoppered flask for 15 minutes. The white crystalline solid thus formed was removed by filtration, washed with water and dried to yield metacresyl benzoate.

Flux Composition

A flux composition was prepared having the following composition.

| | |
|---|---|
| Metacresyl benzoate | 1.0% wt/vol |
| Succinic acid (F) | 0.7% wt/vol |
| Higher fatty alcohol ethoxylate (A) | 0.5% wt/vol |
| Ethylene glycol (S) | 5.0% wt/vol |
| Isopropyl alcohol (S) | Balance |

F = flux-activating agent
A = surface active agent
S = solvent

The composition was prepared by dissolving the specified weights of the first four ingredients in isopropyl alcohol solvent and then adding more solvent to make the composition up to 100 ml.

The flux composition was applied to the surface of an assembled printed circuit board. The board was then passed above the pre-heater and through the molten solder of a conventional wave soldering machine.

The resultant joints were properly formed without icicles or bridges and there was very little visible residue on the board surface.

EXAMPLES 2 to 4

Flux compositions having the constituents detailed below were prepared and tested using the same procedure as described for Example 1.

| | | |
|---|---|---|
| 2. | Imsol DPM (methyl ether of dipropylene glycol) (S) | 5% wt/vol |
| | Succinic acid (F) | 0.7% wt/vol |
| | Paracresol benzoate | 1.0% wt/vol |
| | Isopropyl alcohol (S) | Balance |
| 3. | Adipic acid (F) | 1% wt/vol |
| | Phenyl benzoate | 1% wt/vol |
| | Texofor A45 (A) (a higher fatty alcohol ethoxylate) | 0.5% wt/vol |
| | Methanol (S) | Balance |
| 4. | 2,6-dimethyl phenyl benzoate | 0.5% wt/vol |
| | Ethylene glycol (S) | 5% wt/vol |
| | Suberic acid (F) | 1% wt/vol |
| | Synperonic NP 35 (A) (a nonyl | 0.75% wt/vol |

|                                  |         |
| -------------------------------- | ------- |
| phenyl ethoxylate)               |         |
| Isopropyl alcohol (S)            | Balance |

Texofor A45 is available from ABM Chemicals while Symperonic NP 35 can be obtained from ICI.

For all examples good joints were obtained with little visible residue.

We claim:

1. A flux composition comprising at least one benzoate selected from the group consisting of benzoates of phenol, substituted benzoates of phenol, benzoates of substituted phenols and substituted benzoates of substituted phenols; a solvent for benzoate; and a flux-activating agent; the benzoate being present in an amount not more than its limit of solubility in the solvent.

2. A flux composition as claimed in claim 1 which further comprises a surface active agent.

3. A flux composition as claimed in claim 1 which includes a surface active agent selected from the group consisting of fatty alcohol ethoxylates, octyl and nonyl phenyl ethoxylates and ester ethoxylates.

4. A flux composition as claimed in claim 1 in which said at least one benzoate is selected from the group consisting of phenyl benzoate, metacresyl benzoate, orthocresyl benzoate, paracresyl benzoate, 2,6-dimethylphenyl benzoate, and 3-ethylphenyl-4-methoxy benzoate.

5. A flux composition as claimed in claim 1 in which the solvent is selected from the group consisting of isopropanol, methanol, ethanol, butanol, diethylene glycol, ethylene glycol, acetone and methylethylketone, and a mixture of two or more thereof.

6. A flux composition as claimed in claim 1 in which said at least one benzoate is present in the composition in an amount of at least 0.5% wt/vol.

7. A flux composition as claimed in claim 1 in which said at least one benzoate is present in the composition in an amount of about 1 wt %.

8. A flux composition as claimed in claim 1 in which the flux-activating agent is selected from the group consisting of organic acids, aryl sulphonic acids, hydrohalide salts of aliphatic and aromatic amines and hydrohalide salts of aliphatic hydroxyamines.

9. A flux composition as claimed in claim 1 in which the flux-activating agent comprises an organic acid selected from the group consisting of adipic acid, benzoic acid, azelaic acid, succinic acid and suberic acid.

10. A flux composition as claimed in claim 1 which comprises metacresyl benzoate, orthocresyl benzoate, paracresyl benzoate or 2,6-dimethylphenyl benzoate, isopropanol and a flux-activating agent.

11. A method of preparing a printed circuit board for soldering which includes the step of applying a flux composition as claimed in claim 1 to the surface of the printed circuit board before soldering.

12. A printed circuit board which has been prepared for soldering by a method which comprises (a) providing a printed circuit board, and (b) applying to said circuit board a flux composition comprising at least one benzoate selected from the group consisting of benzoates of phenol, substituted benzoates of phenol, benzoates of substituted phenols and substituted benzoates of substituted phenols; a solvent for the benzoate; and a flux-activating agent; the benzoate being present in an amount not more than its limit of solubility in the solvent.

* * * * *